(12) United States Patent
Medin et al.

(10) Patent No.: US 6,549,400 B1
(45) Date of Patent: Apr. 15, 2003

(54) METHOD AND SYSTEM FOR QUICKLY CONNECTING A 1U PERSONAL COMPUTER

(75) Inventors: David T. Medin, Marion, IA (US); Scott Kayser, Cedar Rapids, IA (US); Robert D. Hinds, Mechanicsville, IA (US); Curtis R. Nelson, Cedar Rapids, IA (US)

(73) Assignee: Crystal Group Inc., Hiawatha, IA (US)

( * ) Notice: Subject to any disclaimer, the term of this patent is extended or adjusted under 35 U.S.C. 154(b) by 202 days.

(21) Appl. No.: 09/681,120

(22) Filed: Jan. 12, 2001

(51) Int. Cl.$^7$ ................................................. G06F 1/16
(52) U.S. Cl. ........................ 361/686; 361/727; 361/683; 312/223.1; 312/692; 439/660; 439/62
(58) Field of Search ................................ 361/683, 686, 361/679, 724–727, 803; 312/223.1, 223.2, 223.3, 692; 439/325, 460, 61, 62

(56) References Cited

U.S. PATENT DOCUMENTS

| | | | |
|---|---|---|---|
| 4,729,424 A | * 3/1988 | Mizuno et al. ............. 165/261 |
| 5,301,346 A | * 4/1994 | Notarianni et al. ......... 361/686 |
| 5,460,441 A | * 10/1995 | Hastings et al. ......... 312/223.2 |
| 5,761,033 A | * 6/1998 | Wilhelm ..................... 361/686 |
| 5,801,921 A | * 9/1998 | Miller ........................ 361/686 |
| 5,963,424 A | * 10/1999 | Hileman et al. ............ 361/687 |
| 6,175,490 B1 | * 1/2001 | Papa et al. ................ 312/223.2 |
| 6,273,730 B1 | * 8/2001 | Chang ......................... 439/61 |
| 6,414,843 B1 | * 7/2002 | Takeda .................. 165/104.32 |
| 6,437,980 B1 | * 8/2002 | Casebolt ................ 165/104.21 |

* cited by examiner

Primary Examiner—Darren Schuberg
Assistant Examiner—Lisa Lea-Edmonds
(74) Attorney, Agent, or Firm—Simmons, Perrine, Albright & Ellwood PLC

(57) ABSTRACT

A system and method for blind-mateably electrically connecting a 1U industrial personal computer with an industrial PC receiving bay in a rack, where the 1U industrial personal computer has a protuberant printed circuit trace member extending therefrom for cooperation with a blind-mateable connector assembly having a plurality of conductive trace grasping contacts therein.

19 Claims, 2 Drawing Sheets

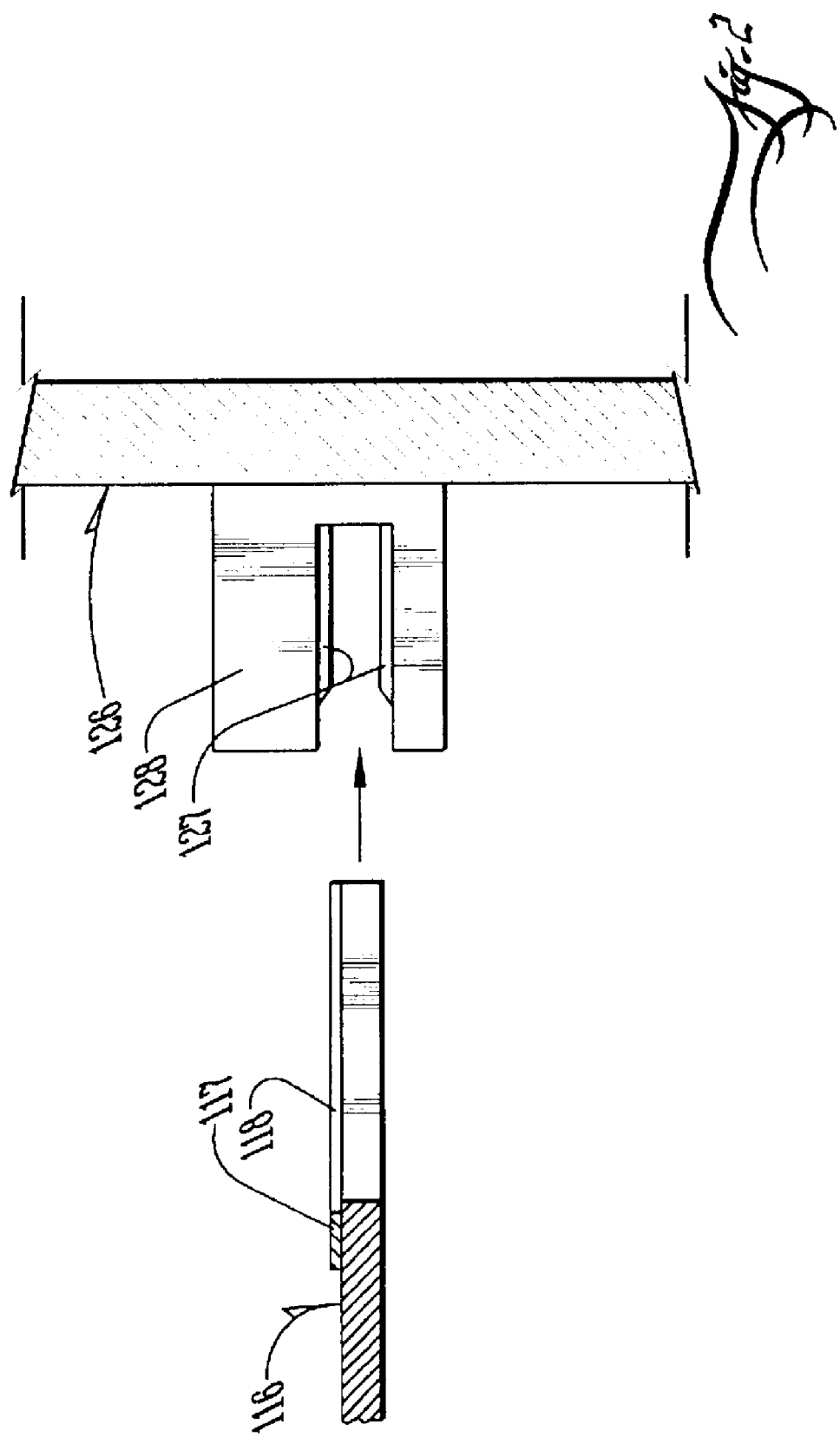

METHOD AND SYSTEM FOR QUICKLY CONNECTING A 1U PERSONAL COMPUTER

BACKGROUND OF THE INVENTION

In recent years, industrial personal computers have become increasingly prevalent in many industries. It is not uncommon today to see rows of industrial PCs arranged in racks. While many of these industrial PCs are often designed and manufactured to higher standards than consumer PCs, they still are occasionally in need of repair. Typically, when a repair is needed, the PC is removed from the rack and taken to a computer repair facility. To remove the PC from the rack requires disconnecting the numerous connections between the PC and the wiring in the rack. Full-size industrial computers have enjoyed much success with blind-mateable connectors between the PC and the rack.

While these blind-mateable connectors have been used extensively in the past with full-size industrial PCs, they do have some drawbacks when used with smaller 1U industrial PCs. For example, the typical blind-mateable connectors may be too large to easily fit in the usable space, in the back of a 1U industrial PC. It has been generally accepted in the art of manufacturing 1U industrial personal computers that the only way to connect the computer to a rack is to manually connect a wiring harness to a connector on the terminal end of the 1U industrial personal computer.

Consequently, there exists a need for improved methods and systems for connecting 1U industrial personal computers in an efficient manner.

SUMMARY OF INVENTION

It is an object of the present invention to provide a system and method for connecting a 1U industrial personal computer in an efficient manner.

It is a feature of the present invention to utilize an elongated printed circuit board which extends beyond the end of the rear of the case of the 1U PC.

It is an advantage of the present invention to achieve improved efficiency in installation of 1U industrial personal computers.

The present invention is an apparatus and method for installing 1U industrial personal computers designed to satisfy the aforementioned needs, provide the previously stated objects, include the above-listed features, and achieve the already articulated advantages. The present invention is carried out in a "wasted time-less" manner in a sense that the time consumed with connecting and disconnecting individual wires between a 1U industrial PC and a rack, has been greatly reduced.

Accordingly, the present invention is a system and method including a 1U industrial PC having a blind mateable connector disposed thereon for cooperation with an associated blind mateable connector in the rack.

BRIEF DESCRIPTION OF DRAWINGS

The invention may be more fully understood by reading the following description of the preferred embodiments of the invention, in conjunction with the appended drawings wherein:

FIG. 2 is an enlarged side view of a portion of the apparatus shown in FIG. 1.

DETAILED DESCRIPTION

Figure 1:
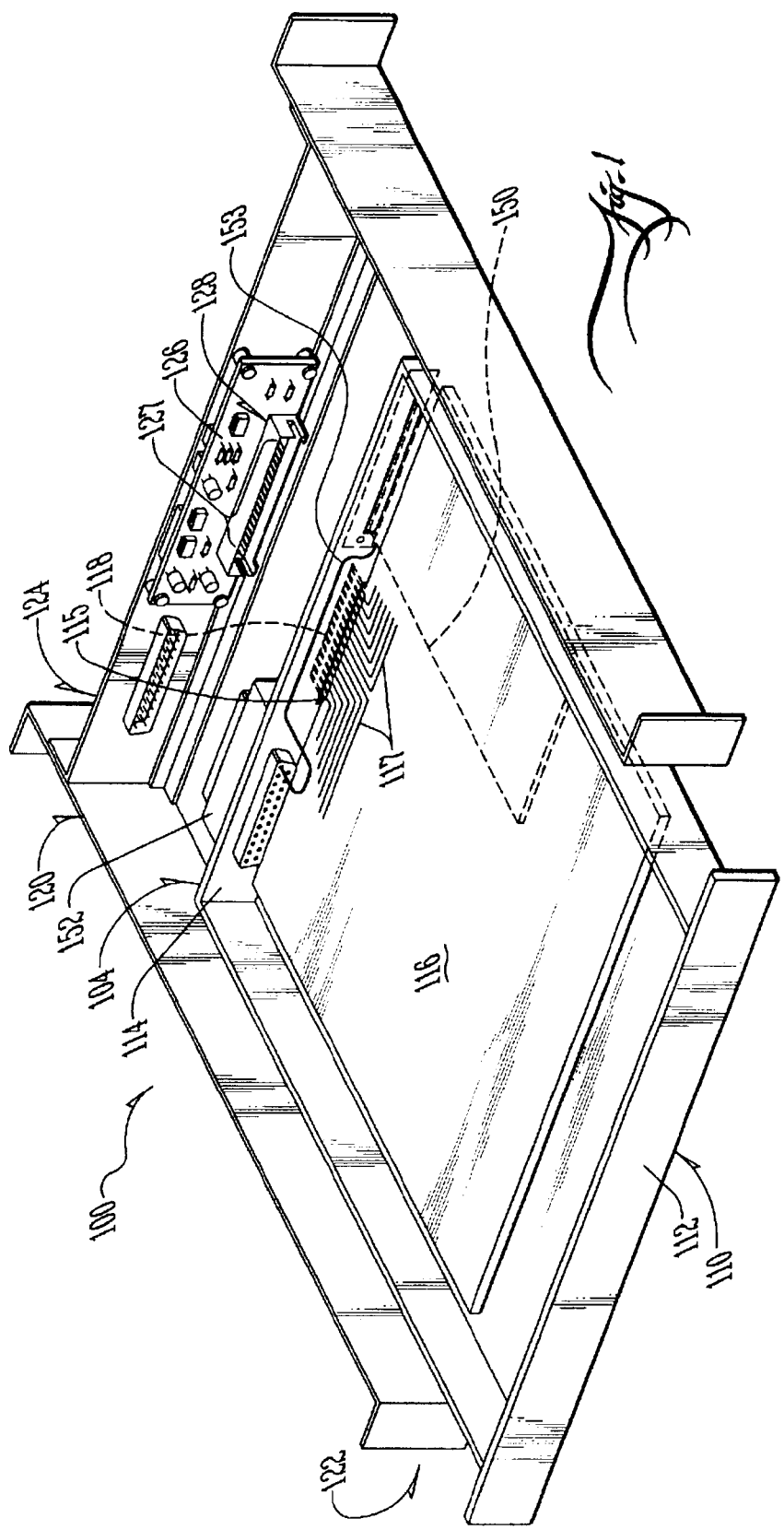
FIG. 1 is a simplified perspective view of a system of the present invention.

Now referring to the drawings wherein like numerals refer to like matter throughout, and more specifically referring to FIG. 1, there is shown a system of the present invention generally designated 100, including a 1U industrial personal computer 110 for insertion into a industrial PC receiving bay 120. The term "1U" is well known in the art to describe a computer which is approximately 1¾ inches in height.

Throughout this description, the terms "industrial personal computer, "PC" or "industrial computer" are used to represent a PC of the type which is capable of being stored in racks of multiple rows of PCs, where each row has multiple PCs and where the PCs are coupled to wiring associated with the rack and other equipment by at least one connector at the rear end 104 of the PC 100. This definition of industrial PCs is not intended to include laptop PCs which have a connector on the rear end of the laptop for coupling with a docking station or a port replicator. Consequently, the term "industrial PC" will specifically exclude any computer where the width dimension w is greater than three times the height dimension d and which has along its top side a hinged display screen which is hinged along the rear end of the PC. The terms "remotely monitored industrial PC" or "remotely monitored industrial computer" are hereby defined to include industrial computers with internal apparatus for monitoring the environmental conditions inside the PC, such as processor temperature, fan speeds, ambient internal temperature, etc. and for reporting the results of such monitoring to another computer which is not immediately adjacent thereto. The term "blind-mateable" is used to refer to the capability of mating two or more connectors with a process which does not require the computer technician or installer, etc. to actually see the connectors at the time they are being mated.

1U industrial personal computer 110 has a faceplate 112 and an opposing terminal end 114 having a centrally disposed orifice 115 therein which could be a narrow slot or other configuration. Printed circuit board 116 represents any PC board in the 1U industrial personal computer 110 which has a plurality of printed circuit traces 117 thereon which extend in a protuberant printed circuit trace member 118. In a preferred embodiment, the printed circuit board 116 may be an alarm card or another card which is coupled to an alarm or monitoring card which monitors environmental conditions inside 1U industrial personal computer 110, such as processor temperature, fan speeds, internal ambient temperature, etc. Printed circuit board 116 would, in such a preferred embodiment, have electrical traces thereon which carry alarm signals which are representative of such measured environmental conditions inside said 1U industrial personal computer 110. In a preferred embodiment, at least one of said printed circuit traces 117 is a trace carrying said alarm signals. Protuberant printed circuit trace member 118 protrudes from the 1U industrial personal computer 110. The dotted lines represent the periphery of protuberant printed circuit trace member 118, as well as the printed circuit traces 117 disposed thereon, which are occluded from view by the terminal end 114. The alarm signals are preferably provided to another PC, which monitors the 1U industrial personal computer 110 from a distance.

Industrial PC receiving bay 120 is preferably one of many PC bays in a rack. Industrial PC receiving bay 120 has a PC bay front end 122 and a PC bay back end 124. Blind-mateable connector mount 126 is disposed on PC bay back end 124 and contains thereon blind-mateable connector assembly 128. Blind-mateable connector assembly 128 is shown as a plurality of conductive trace grasping contacts 127, which are adapted and configured to maintain contact with and accept electrical signals from printed circuit traces 117 when 1U industrial personal computer 110 is inserted into industrial PC receiving bay 120, so that protuberant printed circuit trace member 118 mates with blind-mateable connector assembly 128.

A standard pin and socket connector 152 is also included on opposing terminal end 114. This may be either the male or female end of such a connector. Standard pin and socket connector 152 is provided to give additional functionality for a later installed expansion card 150 which is drawn in broken lines to better convey that such expansion card 150 is not installed in the 1U industrial personal computer 110 at the time of manufacture, but is a later installed item. A connection line 153 is drawn from connector 152 to expansion card 150. It is drawn simply as a single line; however, it should be understood to represent numerous lines, as well as internal connectors for readily connecting with the expansion card 150.

A more detailed understanding of the present invention can be achieved by now referring to FIG. 2, which shows an enlarged side view of a portion of the apparatus shown in FIG. 1. Blind-mateable connector mount 126 is shown holding blind-mateable connector assembly 128, which has a pair of conductive trace grasping contacts 127. The conductive trace grasping contacts 127 can be biased toward maintaining contact with printed circuit traces 117 when protuberant printed circuit trace member 118 is inserted in blind-mateable connector assembly 128.

A preferred embodiment of the present invention is a blind-mateable circuit card protuberance and resilient contacts; however, other blind-mateable connectors could be used as well. For example, pin and socket-type connectors could be substituted.

In operation, the apparatus and method of the present invention as described in FIGS. 1–2, could function as follows:

1U industrial personal computer 110 is inserted into industrial PC receiving bay 120. Protuberant printed circuit trace member 118 with printed circuit traces 117 thereon is thereby caused to fit into blind-mateable connector assembly 128 and be engaged by conductive trace grasping contacts 127 disposed therein. Electrical connections between the 1U industrial personal computer 110 and the rack with industrial PC receiving bay 120 are thereby accomplished. The alarm signals representative of measured environmental conditions inside 1U industrial personal computer 110, such as processor temperature, fan speed, and internal ambient temperature, are thereby communicated to a distant monitoring PC, which is coupled to a network, which is coupled to conductive trace grasping contacts 127 and blind-mateable connector assembly 128.

Throughout this description, reference is made to alarm signals, etc. It should be understood that any type of signal could be communicated using the present invention, such as, but not limited to, serial port signals, Ethernet and others, as well as providing power to the 1U industrial personal computer.

Throughout this description, reference is made to an industrial PC and to a printed circuit board, because it is believed that the beneficial aspects of the present invention would be most readily apparent when used in connection with industrial PCs and printed circuit boards; however, it should be understood that the present invention is not intended to be limited to industrial PCs and printed circuit boards and should be hereby construed to include other non-industrial PCs and non-printed circuit boards as well.

It is thought that the method and apparatus of the present invention will be understood from the foregoing description and that it will be apparent that various changes may be made in the form, construct steps, and arrangement of the parts and steps thereof, without departing from the spirit and scope of the invention or sacrificing all of their material advantages. The form herein described is merely a preferred exemplary embodiment thereof.

What is claimed is:

1. A system comprising:
    a 1U industrial personal computer;
    a rack for containing a plurality of 1U industrial personal computers;
    said 1U industrial personal computer having a blind-mateable PC connector thereon which mates to a blind-mateable connector assembly coupled to rack; and
    wherein said 1U industrial personal computer is a remotely monitored industrial PC.

2. A system comprising:
    a 1U industrial personal computer;
    a rack for containing a plurality of 1U industrial personal computers;
    said 1U industrial personal computer having a blind-mateable PC connector thereon which mates to a blind-mateable connector assembly coupled to rack; and
    wherein said blind-mateable PC connector is a protuberant printed circuit trace member protruding through a void in a terminal end of 1U industrial personal computer.

3. A system of claim 2 wherein said 1U industrial personal computer is a remotely monitored industrial PC.

4. A system of claim 3 wherein said blind-mateable connector assembly includes a plurality of conductive trace grasping contacts for electrically connecting with a plurality of printed circuit traces on said protuberant printed circuit trace member.

5. A system of claim 4 wherein at least one of said printed circuit traces carries alarm signals representative of measured environmental conditions within said 1U industrial personal computer.

6. A system of claim 5 wherein said measured environmental conditions comprise measured temperatures of an operational microprocessor disposed in said 1U industrial personal computer.

7. A system of claim 6 wherein said measured environmental conditions comprise measured internal ambient temperatures in said 1U industrial personal computer.

8. A system of claim 6 wherein said measured environmental conditions comprise measured fans speeds of an operational fan disposed in said 1U industrial personal computer.

9. A system of claim 8 wherein said plurality of conductive trace grasping contacts comprise a plurality of pairs of conductive trace grasping contacts where each pair includes two vertically aligned contacts which are biased, when free from contact with said protuberant printed circuit trace member, to have a distance therebetween which is less than a thickness dimension of said protuberant printed circuit trace member.

10. A system of claim 9 further comprising a secondary pin and socket connector coupled to an expansion slot in said 1U industrial personal computer to allow for inclusion of an additional card which can be blind mateably connected.

11. A method of connecting a 1U industrial personal computer comprising the steps of:

providing a rack having a plurality of industrial PC receiving bays therein;

providing a 1U industrial personal computer;

inserting said 1U industrial personal computer into an industrial PC receiving bay in said rack;

further inserting said 1U industrial personal computer, so that a blind-mateable connector coupled to said 1U industrial personal computer mates with a blind-mateable connector assembly coupled to said rack; and wherein said blind mateable connector is a protuberant printed circuit trace member.

12. A method of claim 11 further comprising the step of spreading apart a plurality of pairs of conductive trace grasping contacts, so as to contact a topside and a bottom side of said protuberant printed circuit trace member.

13. A method of claim 12 further comprising monitoring a temperature characteristic of a microprocessor in said 1U industrial personal computer, and generating an alarm signal in response thereto and causing said alarm signal to be carried through one of said pairs of conductive trace grasping contacts.

14. A method of claim 13 further comprising monitoring said alarm signal at a monitoring PC coupled to a network coupled to said one of said pairs, where said monitoring PC is not adjacent to said 1U industrial personal computer.

15. A method of claim 14 further comprising the step of inserting an expansion card in said 1U industrial personal computer and thereby coupling said expansion card to a pin and socket connector on said 1U industrial personal computer.

16. An apparatus comprising:

a 1U industrial personal computer;

a rack having a plurality of industrial PC receiving bays;

means for blind-mateably electrically connecting said 1U industrial personal computer with a network having portions thereof disposed in said rack; and in said 1U industrial personal computer, means for monitoring a microprocessor temperature and a speed of a fan in said 1U industrial personal computer.

17. An apparatus of claim 16 wherein said means for blind-mateably electrically connecting comprises means for contacting a protuberant printed circuit trace member, protruding through a void in said 1U industrial personal computer.

18. An apparatus of claim 17 wherein said 1U industrial personal computer is substantially 1 and ¾ inches in height.

19. An apparatus of claim 18 further comprising a secondary pin and socket connector coupled to an expansion slot in said 1U industrial personal computer to allow for inclusion of an additional card which can be blind mateably connected.

* * * * *